(12) United States Patent
Sanchez et al.

(10) Patent No.: US 11,239,836 B2
(45) Date of Patent: *Feb. 1, 2022

(54) LOW RESISTIVE LOAD SWITCH WITH OUTPUT CURRENT CONTROL

(71) Applicant: Dialog Semiconductor (UK) Limited, London (GB)

(72) Inventors: Jerome Sanchez, Munich (DE); Fabio Rigoni, Karlsfeld (DE); Jan Grabinski, Owen (DE); Ali Zahabi, Fuerstenfeldbruck (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/854,315

(22) Filed: Apr. 21, 2020

(65) Prior Publication Data

US 2020/0252060 A1 Aug. 6, 2020

Related U.S. Application Data

(62) Division of application No. 16/039,923, filed on Jul. 19, 2018, now Pat. No. 10,666,245.

(30) Foreign Application Priority Data

Jul. 19, 2017 (DE) .......................... 102017212354.0

(51) Int. Cl.
*H03K 17/06* (2006.01)
*H02M 3/07* (2006.01)
(Continued)

(52) U.S. Cl.
CPC ............ *H03K 17/063* (2013.01); *H02M 3/07* (2013.01); *H03K 17/0822* (2013.01);
(Continued)

(58) Field of Classification Search
CPC ............ H03K 17/0822; H03K 17/687; H03K 17/063; H03K 2017/0806; H03K 2217/0027; H03K 2217/0081; H02M 3/07
See application file for complete search history.

(56) References Cited

U.S. PATENT DOCUMENTS 6,411,531 B1 * 6/2002 Nork ...................... H02M 3/073
363/60
8,970,185 B1 3/2015 Sutardja et al.
(Continued)

FOREIGN PATENT DOCUMENTS

DE 10 2015 111 687 A1 1/2016

OTHER PUBLICATIONS

U.S. Notice of Allowance, U.S. Appl. No. 16/039,923, First Named Inventor: Jerome Sanchez, dated Jan. 24, 2020, 10 pages.
(Continued)

*Primary Examiner* — Jue Zhang
(74) *Attorney, Agent, or Firm* — Saile Ackerman LLC; Stephen B. Ackerman

(57) ABSTRACT

A circuit and a method for providing a switchable current linkage between a first terminal and a second terminal is presented. The circuit has a transistor switch and a charge pump circuit. An output node of the charge pump circuit is coupled to a control terminal of the transistor device, and an input node of the charge pump circuit is coupled to a predetermined voltage. The charge pump generates a boosted voltage. A drive circuit provides feedback control for the current flowing through the transistor. The drive circuit also controls the voltage magnitude at the input node of the charge pump circuit in accordance with the feedback control or to control a magnitude of a voltage at the control terminal of the transistor device in accordance with the feedback control.

16 Claims, 6 Drawing Sheets

(51) Int. Cl.
*H03K 17/082* (2006.01)
*H03K 17/687* (2006.01)
*H03K 17/08* (2006.01)

(52) U.S. Cl.
CPC ... *H03K 17/687* (2013.01); *H03K 2017/0806* (2013.01); *H03K 2217/0027* (2013.01); *H03K 2217/0081* (2013.01)

(56) References Cited

U.S. PATENT DOCUMENTS

| | | | |
|---|---|---|---|
| 10,666,245 B2 * | 5/2020 | Sanchez | H02M 3/07 |
| 2009/0072803 A1 * | 3/2009 | Tiew | H02M 1/36 |
| | | | 323/277 |
| 2012/0056655 A1 | 3/2012 | Brauer et al. | |
| 2013/0043931 A1 * | 2/2013 | Khlat | H02M 3/07 |
| | | | 327/536 |
| 2016/0028307 A1 * | 1/2016 | Illing | H02M 3/156 |
| | | | 323/274 |

OTHER PUBLICATIONS

U.S. Office Action, U.S. Appl. No. 16/039,923, Applicant: Sanchez et al., dated Sep. 17, 2019, 15 pages.
German Office Action, File Ref: 10 2017 212 354.0, Applicant: Dialog Semiconductor (UK) Limited, dated Jul. 5, 2018, 7 pages.

* cited by examiner

LOW RESISTIVE LOAD SWITCH WITH OUTPUT CURRENT CONTROL

This is a Divisional application of U.S. patent application Ser. No. 16/039,923, filed on Jul. 19, 2018, which is herein incorporated by reference in its entirety, and assigned to a common assignee.

TECHNICAL FIELD

This application relates to circuits for providing a switchable current linkage between a first terminal and a second terminal via a transistor device and methods of operating circuits for providing a switchable current linkage between a first terminal and a second terminal via a transistor device. Switchable current linkage is understood to indicate an electrical connection that allows a current to flow, that can be enabled and disenabled as desired. The application particularly relates to such circuits and methods that allow for decreased on-state resistance of the transistor device and/or reduced size of the transistor device. These circuits and methods are particularly, though not exclusively, applicable to providing a switching capability between regulated supply voltages of DC/DC converters and external loads with minimum on-state resistance.

BACKGROUND

Modern power management integrated circuits (PMICs) incorporate a variety of different load switches to connect external loads to the regulated supply voltage of DC/DC converters. In order to deliver high currents without causing a significant drop on the supply line, the load switches should have a very low on-state resistivity, RdsOn.

SUMMARY

Load switches should be equipped with a functionality to protect themselves from too high inrush currents, which could thermally damage the load switch or cause a large voltage drop on the supply line.

Thus, there is a need for an improved circuit for providing a switchable current linkage between a first terminal and a second terminal via a transistor device and for an improved method of operating a circuit for providing a switchable current linkage between a first terminal and a second terminal via a transistor device. There further is a need for such circuit and method that reduce the on-state resistance of the transistor device and/or decrease a device size of the transistor device.

In view of some or all of these needs, the present disclosure proposes a circuit for providing a switchable current linkage and a method of operating a circuit for providing a switchable current linkage, having the features of the respective independent claims.

An aspect of the disclosure relates to a circuit for providing a switchable current linkage (e.g., a switching capability) between a first terminal and a second terminal. The circuit may include a transistor device that acts as a switch device (e.g., as a switch). The transistor device may be a MOSFET, such as an NMOS transistor or a PMOS transistor, for example. The circuit may further include a charge pump circuit (as an example of a boost circuit). The charge pump circuit may include a charge pump or a charge pump based regulator, for example. An output node of the charge pump circuit may be coupled (e.g., connected) to a control terminal (e.g., gate terminal) of the transistor device. An input node of the charge pump circuit may be coupled (e.g., connected) to a predetermined voltage (e.g., supply voltage or low-impedance reference voltage) on the circuit (e.g., on the chip). The charge pump circuit may be adapted to generate a boosted voltage that has the same sign as a voltage at the input node of the charge pump circuit but a greater magnitude than the voltage at the input node of the charge pump circuit. The circuit may further include a drive circuit coupled (e.g., connected) to the charge pump circuit. The drive circuit may be adapted to provide feedback control for controlling (e.g., driving) the current flowing through the transistor device based on a quantity indicative of the current flowing through the transistor device or a voltage drop across the transistor device. For example, the current may be controlled such that the current does not exceed a given threshold, or such that a slew rate of the voltage drop across the transistor device does not exceed a given limit, for example. To this end, the circuit may include a sense circuit for sensing said quantity. The drive circuit may be further adapted to control a magnitude of the voltage at the input node of the charge pump circuit in accordance with the feedback control. In this case, the drive circuit may be coupled (e.g., connected) to the input node of the charge pump circuit. Alternatively, the drive circuit may be coupled (e.g., connected) to the output node of the charge pump circuit and may be supplied by an output of the charge pump circuit. In this case, the drive circuit may be adapted to control a magnitude of a voltage at the control terminal (e.g., gate terminal) of the transistor device in accordance with the feedback control.

Configured as above, the proposed circuit combines control of the gate-source voltage Vgs of the transistor device to the maximum safe voltage with regulation of the output current. In particular, the proposed circuit can apply the maximum safe gate-source voltage Vgsmax (e.g., the maximum gate-source voltage Vgs allowed by the device technology), even if this voltage is not physically existent on the circuit (e.g., on the chip). At the same time, the dependence of the drive voltage on the process and the temperature can be reduced, and the gate-source voltage Vgs can be made independent of the input voltage Vin or the output voltage Vout at the transistor device. Thus, the proposed circuit allows for a wide range of operating voltages, including output voltages very close to the supply voltage or very close to ground. At the same time, an excessive gate-source voltage Vgs at the transistor device can be avoided, and the proposed circuit prevents too high inrush currents from occurring at the transistor device. Thereby, thermal damage of the transistor device and voltage drops of the input voltage Vin (e.g., at a supply line or power rail) can be prevented. Since the device size of the transistor device is proportional to the on-state resistance, part of the decrease of the on-state resistance can be traded in for size reduction of the transistor device.

In some embodiments, the charge pump circuit may also be coupled (e.g., connected) to a source terminal of the transistor device. The charge pump circuit may be adapted to output, as the boosted voltage, a voltage the magnitude of which exceeds the magnitude of the voltage at the input node of the charge pump circuit by at least the magnitude of a voltage at the source terminal of the transistor device. Thereby, it can be ensured that the maximum acceptable voltage (maximum safe voltage) for driving the transistor device is available on the circuit.

In some embodiments, the charge pump circuit may include a capacitive device (e.g., capacitor). The charge pump circuit may further include first to fourth switches (e.g., first to fourth transistor switches) arranged to alternatingly couple (e.g., connect) the capacitive device between the input node of the charge pump circuit and ground, and between the source terminal of the transistor device and the output node of the charge pump circuit. In this configuration, the capacitive device can be used to boost the voltage that is provided at the input node of the charge pump circuit.

In some embodiments, the first switch may be coupled (e.g., connected) between the input node of the charge pump circuit and a first terminal of the capacitive device. The second switch may be coupled (e.g., connected) between a second terminal of the capacitive device and ground. The third switch may be coupled (e.g., connected) between the first terminal of the capacitive device and the output node of the charge pump circuit. The fourth switch may be coupled (e.g., connected) between the second terminal of the capacitive device and the source terminal of the transistor device.

In some embodiments, the circuit may further include a control circuit for controlling the charge pump circuit. The control circuit may be adapted to control the first to fourth switches to alternatingly couple (e.g., connect) the capacitive device between the input node of the charge pump circuit and ground, and between the source terminal of the transistor device and the output node of the charge pump circuit. The first and second switches may be controlled in accordance with a first switch control signal, and the third and fourth switches may be controlled in accordance with a second switch control signal. The first and second switch control signals may be in antiphase with each other.

In some embodiments, the drive circuit may be coupled (e.g., connected) to the input node of the charge pump circuit. In this case, the drive circuit may be adapted to control the magnitude of the voltage at the input node of the charge pump circuit in accordance with the feedback control. The drive circuit may control the magnitude of the voltage at the input node of the charge pump circuit by sinking a current from the input node of the charge pump circuit or by sourcing a current to the input node of the charge pump circuit. Accordingly, a pre-driver architecture is provided in which is the charge pump circuit operates under control of the pre-driver and the transistor device can be directly driven by the boost voltage generated by the charge pump circuit.

In some embodiments, the drive circuit may be adapted to compare the quantity indicative of the current flowing through the transistor device or the voltage drop across the transistor device to a reference value for said quantity. The drive circuit may be further adapted to sink the current from the input node of the charge pump circuit based on a result of the comparison, or to source the current to the input node of the charge pump circuit based on the result of the comparison. Thereby, the boost voltage generated by the charge pump circuit, and likewise the gate-source voltage Vgs of the transistor device, can be controlled such that an inrush current to the transistor device or a slew rate of the output voltage does not attain too large values.

In some embodiments, the circuit may further include a replica device of the transistor device. The replica device may be connected in parallel to the transistor device. A control terminal (e.g., gate terminal) of the replica device may be coupled (e.g., connected) to the control terminal (e.g., gate terminal) of the transistor device. The drive circuit may include a current generator coupled (e.g., connected) between the replica device and ground. The drive circuit may further include a differential amplifier. One input terminal of the differential amplifier may be coupled (e.g., connected) to an intermediate node between the current generator and the replica device. The other input terminal of the differential amplifier may be coupled (e.g., connected) to the source terminal of the transistor device. The drive circuit may further include a first drive circuit transistor that operates under control of the differential amplifier and is coupled (e.g., connected) between the intermediate node and ground. The drive circuit may further include a second drive circuit transistor that forms a current mirror with the first drive circuit transistor and is coupled (e.g., connected) between the input node of the charge pump circuit and ground. This circuit provides a simple and efficient implementation of the pre-driver architecture.

In some embodiments, the drive circuit may be coupled (e.g., connected) to the output node of the charge pump circuit and may be supplied by the output of the charge pump circuit. Then, the drive circuit may be adapted to control the magnitude of the voltage at the control terminal of the transistor device in accordance with the feedback control, by sinking a current from the control terminal of the transistor device or by sourcing a current to the control terminal of the transistor device. Accordingly, a post-driver architecture is provided in which the charge pump circuit always outputs a voltage that is above the source voltage of the transistor device by the maximum safe voltage, and the post-driver, supplied by the charge pump circuit, appropriately drives the transistor device.

In some embodiments, the drive circuit may be adapted to compare the quantity indicative of the current flowing through the transistor device or the voltage drop across the transistor device to a reference value for said quantity. The drive circuit may be further adapted to sink the current from the control terminal of the transistor device based on a result of the comparison, or to source the current to the control terminal of the transistor device based on the result of the comparison. Thereby, the gate-source voltage Vgs of the transistor device can be controlled such that the inrush current to the transistor device or the slew rate of the output voltage of the transistor device does not attain too large values.

In some embodiments, the drive circuit may include a feedback control block coupled (e.g., connected) to the source terminal of the transistor device. The feedback control block may be adapted to output a signal that is indicative of a change rate (e.g., slew rate) of the voltage at the source terminal of the transistor device. The drive circuit may further include a differential amplifier. One input terminal of the differential amplifier may be coupled (e.g., connected) to an output of the feedback control block. The other input terminal of the differential amplifier may be coupled (e.g., connected) to a reference signal. The drive circuit may further include a first drive circuit transistor that operates under control of the differential amplifier. The drive circuit may further include second and third drive circuit is transistors that are arranged to form a current mirror. The first and second drive circuit transistors may be coupled (e.g., connected) in series between the output node of the charge pump circuit and ground. The drive circuit may further include a current generator. The third drive circuit transistor and the current generator may be coupled (e.g., connected) in series between the output node of the charge pump circuit and ground. An intermediate node between the third drive circuit transistor and the current generator may be coupled (e.g., connected) to the control terminal of the transistor device. This circuit provides a simple and efficient implementation of the pre-driver architecture.

In some embodiments, the circuit may further include a regulating circuit coupled (e.g., connected) between the output node of the charge pump circuit and the drive circuit. The regulating circuit may be adapted to apply a DC shift to the output of the charge pump circuit. Alternatively or additionally, the regulating circuit may be adapted to reduce an output impedance of the charge pump circuit. The regulating circuit may include or may be a transistor, for example. The transistor may be of the same type as the transistor device, such as an NMOS transistor or PMOS transistor, for example. Thereby, any threshold effects can be corrected for and the output impedance of the charge pump circuit can be improved.

In some embodiments, the circuit may further include a second charge pump circuit for generating the predetermined voltage.

Another aspect of the disclosure relates to a method of controlling a circuit for providing a switchable current linkage between a first terminal and a second terminal. The circuit may include a transistor device that acts as a switch device. The method may include generating, by means of a charge pump circuit, a boosted voltage that has the same sign as a voltage at an input node of the charge pump circuit but a greater magnitude than the voltage at the input node of the charge pump circuit. An output node of the charge pump circuit may be coupled (e.g., connected) to a control terminal of the transistor device and the input node of the charge pump circuit may be coupled (e.g., connected) to a predetermined voltage on the circuit. The method may further include providing feedback control for controlling the current flowing through the transistor device based on a quantity indicative of the current flowing through the transistor device or a voltage drop across the transistor device. The method may yet further include controlling a magnitude of the voltage at the input node of the charge pump circuit in accordance with the feedback control or controlling a magnitude of a voltage at the control terminal of the transistor device in accordance with the feedback control.

In some embodiments, the charge pump circuit may be also coupled (e.g., connected) to a source terminal of the transistor device. Then, the method may include generating, as the boosted voltage, a voltage the magnitude of which exceeds the magnitude of the voltage at the input node of the charge pump circuit by at least the magnitude of a voltage at the source terminal of the transistor device.

In some embodiments, the charge pump circuit may include a capacitive device. The charge pump circuit may further include first to fourth switches arranged to alternatingly couple (e.g., connect) the capacitive device between the input node of the charge pump circuit and ground, and between the source terminal of the transistor device and the output node of the charge pump circuit.

In some embodiments, the first switch may be coupled (e.g., connected) between the input node of the charge pump circuit and a first terminal of the capacitive device. The second switch may be coupled (e.g., connected) between a second terminal of the capacitive device and ground. The third switch may be coupled (e.g., connected) between the first terminal of the capacitive device and the output node of the charge pump circuit. The fourth switch may be coupled (e.g., connected) between the second terminal of the capacitive device and the source terminal of the transistor device.

In some embodiments, the method may further include controlling the first to fourth switches to alternatingly couple (e.g., connect) the capacitive device between the input node of the charge pump circuit and ground, and between the source terminal of the transistor device and the output node of the charge pump circuit.

In some embodiments, the method may further include controlling the magnitude of the voltage at the input node of the charge pump circuit in accordance with the feedback control, by sinking a current from the input node of the charge pump circuit or by sourcing a current to the input node of the charge pump circuit.

In some embodiments, the method may further include comparing the quantity indicative of the current flowing through the transistor device or the voltage drop across the transistor device to a reference value for said quantity. The method may further include sinking the current from the input node of the charge pump circuit based on a result of the comparison, or sourcing the current to the input node of the charge pump circuit based on the result of the comparison.

In some embodiments, the method may further include sensing a current that flows through a replica device of the transistor device. The replica device may be coupled (e.g., connected) in parallel to the transistor device. A control terminal of the replica device may be coupled (e.g., connected) to the control terminal of the transistor device. The method may further include sinking a predetermined current from the replica device to ground by means of a current generator (e.g., current sink). The method may further include comparing a voltage at an intermediate node between the current generator and the replica device and the voltage at the source terminal of the transistor device by means of a differential amplifier. The method may yet further include controlling a first drive circuit transistor in dependence on an output of the differential amplifier. The first drive circuit transistor may be coupled (e.g., connected) between the intermediate node and ground and may form a current mirror with a second drive circuit transistor that is coupled (e.g., connected) between the input node of the charge pump circuit and ground.

In some embodiments, the method may further include controlling the magnitude of the voltage at the control terminal of the transistor device in accordance with the feedback control, by sinking a current from the control terminal of the transistor device or by sourcing a current to the control terminal of the transistor device.

In some embodiments, the method may further include comparing the quantity indicative of the current flowing through the transistor device or the voltage drop across the transistor device to a reference value for said quantity. The method may yet further include sinking the current from the control terminal of the transistor device based on a result of the comparison, or sourcing the current to the control terminal of the transistor device based on the result of the comparison.

In some embodiments, the method may further include generating a signal that is indicative of a change rate (e.g., slew rate) of the voltage at the source terminal of the transistor device. The method may further include comparing the signal that is indicative of the change rate (e.g., slew rate) of the voltage at the source terminal of the transistor device to a reference signal by means of a differential amplifier. The method may further include controlling a first drive circuit transistor in dependence on an output of the differential amplifier. The first drive circuit transistor may be coupled (e.g., connected) in series with a second drive circuit transistor between the output node of the charge pump circuit and ground. The second drive circuit transistor may form a current mirror with a third drive circuit transistor that is coupled (e.g., connected) in series with a current generator between the output node of the charge pump circuit and ground. The method may yet further include providing a voltage at an intermediate node between the third drive circuit transistor and the current generator to the control terminal of the transistor device.

In some embodiments, the method may further include applying a DC shift to the output of the charge pump circuit. Alternatively or additionally, the method may include reducing an output impedance of the charge pump circuit.

In some embodiments, the method may further include generating the predetermined voltage using a second charge pump circuit.

Notably, the method may be applied to any of the circuits described above, for example as a method of operating these circuits. In addition to steps for operating these circuits, the method may further include steps for providing or arranging any, some, or all of the elements of these circuits and/or steps for coupling or connecting respective elements of these circuits.

Moreover, it will be appreciated that method steps and apparatus features may be interchanged in many ways. In particular, the details of the disclosed method can be implemented as an apparatus adapted to execute some or all or the steps of the method, and vice versa, as the skilled person will appreciate. In particular, it is understood that methods according to the disclosure relate to methods of operating the circuits according to the above embodiments and variations thereof, and that respective statements made with regard to the circuits likewise apply to the corresponding methods.

It is also understood that in the present document, the term "couple" or "coupled" refers to elements being in electrical communication with each other, whether directly connected e.g., via wires, or in some other manner (e.g., indirectly).

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates an example of a transistor device that may act as a switch device and to which embodiments of this disclosure may be applied, FIG. 2 schematically illustrates an example of a high-level diagram of a circuit according to embodiments of the disclosure, FIG. 3 schematically illustrates an example of another high-level diagram of a circuit according to embodiments of the disclosure, FIG. 4 schematically illustrates an example of a circuit implementation of the diagram of FIG. 3 according to embodiments of the disclosure, FIG. 5 schematically illustrates an example of another high-level diagram of a circuit according to embodiments of the disclosure, FIG. 6 schematically illustrates an example of a circuit implementation of the diagram of FIG. 5 according to embodiments of the disclosure, FIG. 7 schematically illustrates an example of a charge pump circuit usable in circuits according to embodiments of the disclosure, and FIG. 8 schematically illustrates examples of simulated currents and voltages as functions of time in circuits according to embodiments of the disclosure.

DESCRIPTION

Figure 1:
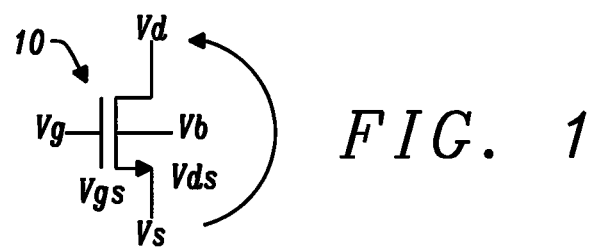

FIG. 1 schematically illustrates an example of a transistor device that may act as a switch device (or simply, switch) for switchably connecting a first terminal and a second terminal and to which embodiments of this disclosure may be applied. Notably, while an NMOS transistor is shown in FIG. 1 and the remaining figures, the present disclosure is likewise applicable to a PMOS transistor, with evident adaptations.

For such transistor device, as for any CMOS switch, the switch resistance, or on-state resistance (RdsOn) is a key parameter. One possibility to reduce the on-state resistance is to choose a very big transistor device to assure an on-state resistance below a specified value over process and temperature variations. However, choosing a very big transistor device leads to increased costs and increased circuit area.

Another possibility is to raise the gate-source voltage Vgs of the transistor device. Namely, when the switch is turned on, its on-state resistance is proportional to the gate-source voltage Vgs. Therefore, the gate-source voltage Vgs on the switch should be driven to the maximal safe voltage value in order to minimize the on-state resistance. That is, one possibility to achieve a lower on-state resistance of the transistor device (e.g., the NMOS in FIG. 1) is to connect the control terminal (e.g., gate) of the transistor device to the maximum supply voltage available on the chip (usually the 5V from a charge pump).

However, the maximum supply voltage available on the chip may not be sufficient for achieving minimum on-state resistance. Considering, for example, the case of a supply voltage on the chip of 5V. When the output voltage Vout at the source of the transistor device is 2V, the maximum gate-source voltage that can be applied to drive the transistor device would be only 3V (i.e., Vg–Vs).

In other words, driving the transistor device with the maximum safe voltage is often a challenge, because the maximum safe voltage typically does not physically exist in the circuit (e.g., on the chip). That is, the maximum safe voltage is typically above the highest accessible voltage on the circuit. Thus, typically, the gate of the transistor device is driven with a voltage lower than its maximum safe voltage value, and as an effect the on-state resistance RdsOn of the transistor device is not minimal.

On the other hand, the switch should be also equipped with a functionality that protects the switch from too high inrush currents (which could thermally damage the switch or result in a high voltage drop on the drain of the switch). This protection may be implemented as a drain-source (Ids) current limit, or a source voltage (Vs) slew rate limit.

The goal is thus to reach the minimum possible on-state resistance of the transistor device that acts as a switch, without exceeding the maximum safe voltage between gate and source. Since the size of the transistor device is proportional to the on-state resistance RdsOn, reduction of on-state resistance can be traded in against size reduction of the transistor device.

The present disclosure proposes a circuit and method that achieve a minimal possible on-state resistance of the switch, without exceeding the maximum safe voltage between gate and source, Vgsmax. Broadly speaking, the present disclosure presents a new concept of using a small local circuit to charge up the gate in such a way that the gate-source voltage Vgs of the transistor device can become the maximum voltage allowed by the technology, Vgsmax (e.g., 5V). This allows to reduce the on-state resistance RdsOn of the transistor device and/or allows choosing a smaller transistor device.

In the remainder of this disclosure, the maximum safe voltage between gate and source of the transistor device may be referred to as Vgsmax.

Figure 2:
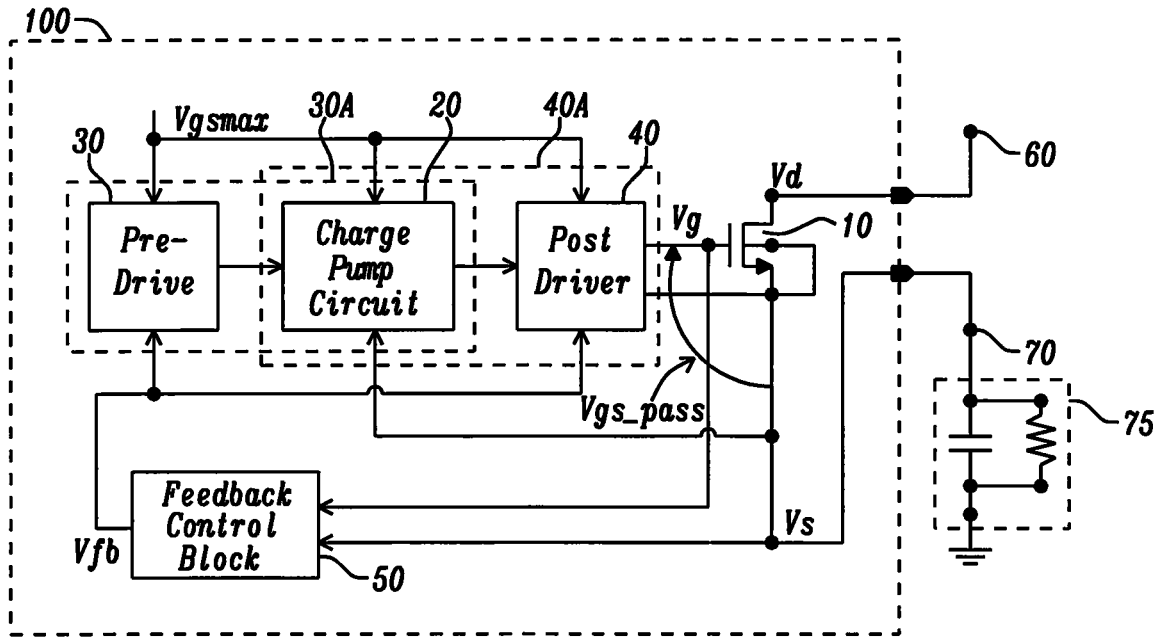

FIG. 2 schematically illustrates an example of a high-level diagram of a circuit 100 according to embodiments of the disclosure. The circuit 100 may be said to be a circuit for providing a switchable current linkage (e.g., switching capability) between a first terminal 60 and a second terminal 70. The circuit 100 comprises a transistor device 10 (e.g., pass device) that acts as a switch device (or simply, switch) for switchably connecting the first terminal 60 and the second terminal 70. An input terminal (e.g., drain terminal of the transistor device 10 is connected to the first terminal 60 of the circuit 100. The first terminal 60 may be coupled to a power rail, for example. An output terminal (e.g., source terminal) of the transistor device 10 is connected to the second terminal 70 of the circuit 100. The second terminal 70 may be coupled to an electric load 75, for example.

A predetermined voltage is available on the circuit 100, e.g., as a supply voltage or a low-impedance reference voltage. Typically, the predetermined voltage on the circuit corresponds to the maximum voltage Vgsmax that can be safely applied between source and gate terminals of the transistor device 10. Typically, the predetermined voltage on the circuit (e.g., chip) is given by the device technology used for the circuit.

However, if the source terminal of the transistor device 10 is at a given non-zero voltage level (i.e., if a voltage at the second terminal 70 is non-zero), the predetermined voltage will not be sufficient for driving the transistor device 10 with a gate-source voltage Vgs that reaches the maximum voltage Vgsmax that can be safely applied.

To address this issue, the circuit 100 further comprises a charge pump circuit (e.g., charge pump or charge pump based regulator; in general, boost circuit) 20. The charge pump circuit 20 generates a control voltage (drive voltage) for controlling the transistor device 10 (either directly, or via a drive circuit). The charge pump circuit 20 is coupled to a control terminal (e.g., gate terminal) of the transistor device 10. In particular, an output node of the charge pump circuit 20 may be coupled (e.g., connected) to the control terminal of the transistor device 10. The charge pump circuit 20 is further coupled (e.g., connected) to the predetermined voltage (predetermined voltage level) on the circuit 100. In particular, an input node of the charge pump circuit 20 may be coupled (e.g., connected) to the predetermined voltage. The predetermined voltage may be a supply voltage on the circuit 100 or a low-impedance reference voltage on the circuit 100, for example. The predetermined voltage may be generated by another (second) charge pump circuit. The second charge pump circuit may be a global charge pump circuit that provides a global supply voltage for all circuit elements on the circuit 100 (e.g., on the chip). By contrast, the charge pump circuit 20 is a local charge pump circuit for the transistor device 10 and circuit elements needed for controlling (driving) the transistor device 10. The charge pump circuit 20 is further coupled (e.g., connected) to the source terminal of the transistor device 10. The charge pump circuit 20 is adapted to generate a boost voltage or boosted voltage (e.g., at its output node) that has the same sign as a voltage at its input node (e.g., the predetermined voltage on the circuit) but a greater magnitude than the voltage at its input node. In particular, the charge pump circuit 20 may be adapted to output (e.g., generate), as the boosted voltage, a voltage that has a magnitude that exceeds the magnitude of the voltage at the input node of the charge pump circuit by at least the magnitude of a voltage Vs at the source terminal of the transistor device. For example, if the voltage at the input node of the charge pump circuit 20 is Vgsmax, then the boosted voltage may be Vs+Vgsmax.

The circuit further comprises a pre-driver 30 and/or a post-driver 40. The pre-driver 30 and the post-driver 40 are examples of a drive circuit. In typical implementations, the circuit 100 only comprises one of the pre-driver 30 and the post-driver 40. Thus, there exist a pre-driver implementation of the circuit 100 (indicated by dashed box 30A) and a post-driver implementation of the circuit 100 (indicated by dashed box 40A). If present, either of the pre-driver 30 and the post-driver 40 is coupled (e.g., connected) to the charge pump circuit 20. In particular, the pre-driver 30 may be coupled (e.g., connected) to the input node of the charge pump circuit 20. The post-driver 40 may be coupled (e.g., connected) to the output node of the charge pump circuit 20. Put differently, the post-driver 40 may be coupled (e.g., connected) to the control terminal of the transistor device 10 and may be supplied by (an output of) the charge pump circuit 20. In general, the drive circuit may be said to be coupled (e.g., connected) to the charge pump circuit 20.

The drive circuit (e.g., the pre-driver 30 or the post driver 40) is adapted to provide feedback control for controlling a current flowing through the transistor device 10. This feedback control may be based on a quantity indicative of the current flowing through the transistor device 10 or a voltage drop across the transistor device 10. To this end, the circuit 100 may comprise a feedback control block (feedback block) 50 coupled to the transistor device 10 (e.g., to the source terminal of the transistor device 10). The feedback control block 50 may output a signal (feedback signal, e.g., feedback voltage or feedback current) that is indicative of the current flowing through the transistor device 10, the voltage drop across the transistor device 10, and/or a change rate (e.g., slew rate) of the current or the voltage drop. The feedback control block 50 may be further coupled to any or all of the pre-driver 30, the charge pump circuit 20, and the post-driver 40, and may provide the feedback signal to any or all of the pre-driver 30, the charge pump circuit 20, and the post-driver 40. In certain implementations, the feedback control block 50 may be part of the respective drive circuit.

The pre-driver 30 (as an example of the drive circuit) may control (e.g., drive) (a magnitude of) the voltage at the input node of the charge pump circuit 20 in accordance with the feedback control (e.g., as required by the feedback control). The post-driver 40 (as another example of the drive circuit), which is coupled to the control terminal (e.g., gate terminal) of the transistor device 10 and supplied by an output of the charge pump circuit 20, may control (a magnitude of) a voltage at the control terminal of the transistor device 10 in accordance with the feedback control (e.g., as required by the feedback control).

Notably, each of the arrowed lines in FIG. 2 connecting respective blocks may be present or absent, depending on whether the circuit 100 uses the pre-driver 30 and/or the post-driver 40, and depending on which feedback signal is output by the feedback control block 50. For example, when slew rate control is used, it is not necessary to provide the gate voltage Vg at the transistor device 10 to the feedback control block 50.

In general, the transistor device 10 is activated if a current linkage between the first terminal 60 and the second terminal 70 of the circuit 100 is desired. To this end, a control voltage (drive voltage) as output by the charge pump circuit 20 or the post-driver 40 (under supply by the charge pump circuit 20) is provided to the control terminal (e.g., gate terminal) of the transistor device 10. The pre-driver 30 and the post-driver 40 may be adapted to provide feedback control during start-up, i.e., after the transistor device 10 has been activated, to avoid high current inrush. After start-up, in a stable condition the gate voltage Vg may eventually reach the level of Vdrive=Vs+Vgsmax).

Summarizing, the circuit 100 may be said to comprise a charge pump, a feedback loop, and a driver for regulating the drain-source current (i.e., the current flowing through the switch). These elements together create a system that will drive the gate-source voltage Vgs of the switch always to the Vgsmax level, subject to feedback control.

Next, a first example implementation of the circuit 100 with a pre-driver 30 and feedback control of the current flowing through the transistor device 10 will be described with reference to FIG. 3 and FIG. 4, and a second example implementation of the circuit 100 with a post-driver 40 and feedback control of the slew rate of the voltage drop across the transistor device 10 will be described with reference to FIG. 5 and FIG. 6.

Figure 3:
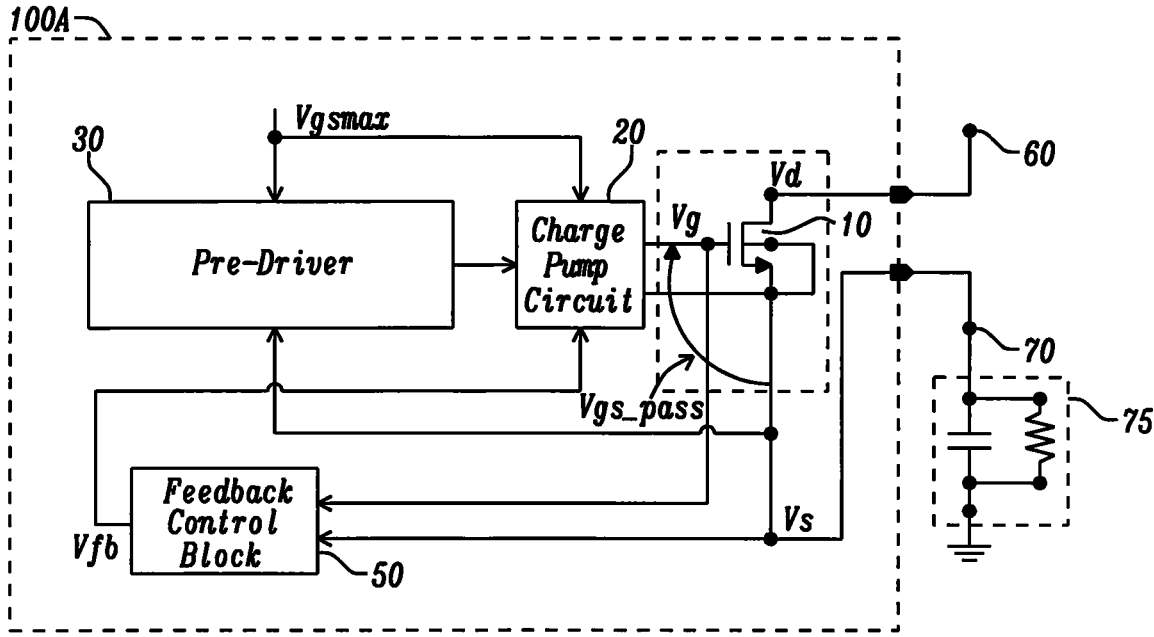

FIG. 3 schematically illustrates an example of another high-level diagram of a circuit 100A according to embodiments of the disclosure. The circuit 100A may be said to be a circuit for providing a switchable current linkage (e.g., switching capability) between a first terminal 60 and a second terminal 70. The circuit 100A differs from circuit 100 in FIG. 2 in that it only includes the pre-driver 30. The pre-driver 30 (as an example of a drive circuit) is coupled (e.g., connected) to the input node of the charge pump circuit 20.

Figure 4:
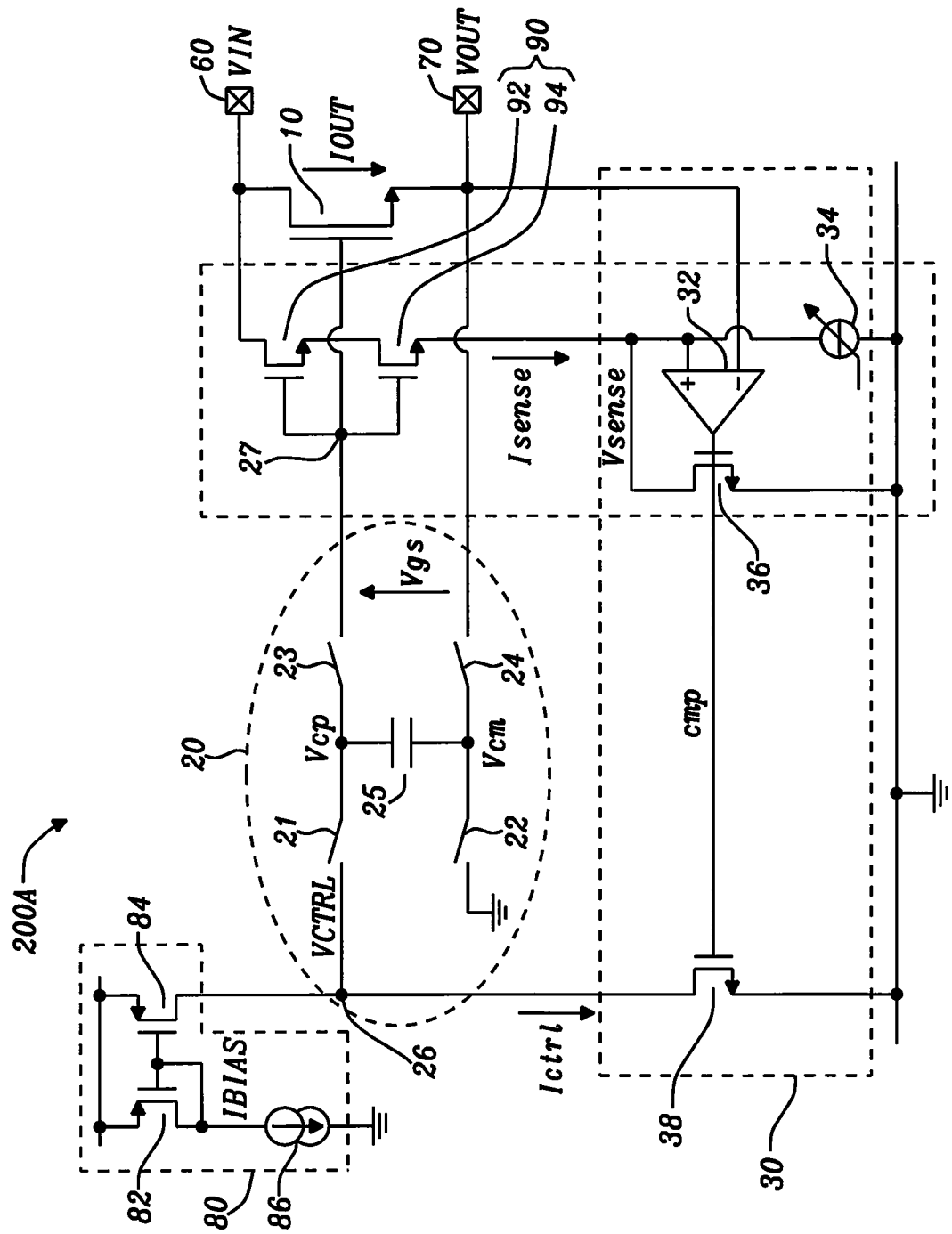

FIG. 4 schematically illustrates an example of a circuit 200A implementing the high-level circuit 100A of FIG. 3. The circuit 200A may be said to be a circuit for providing a switchable current linkage (e.g., switching capability) between a first terminal 60 and a second terminal 70. As was the case for the above circuits, circuit 200A comprises a transistor device 10 (e.g., pass device) coupled (e.g., connected) between the first terminal 60 and the second terminal 70. The transistor device 10 may act as a switch device (or simply, switch), e.g., for switchably connecting the first terminal 60 and the second terminal 70.

As the gate-source voltage Vgs of the switch is a key parameter for reducing the on-state resistance RdsOn of the switch, the present disclosure proposes to use a local charge pump to provide the maximum voltage level that the device technology allows to the gate terminal of the switch.

Accordingly, the circuit 200A comprises a charge pump circuit 20. Function and couplings of the charge pump circuit 20 may be those described above with reference to FIG. 2. For instance, the input node of the charge pump circuit 20 is coupled (e.g., connected) to the predetermined voltage on the circuit 200A, and the output node of the charge pump circuit is coupled (e.g., connected) to the control terminal (e.g., gate terminal) of the transistor device 10. The predetermined voltage may be the voltage Vgsmax. The charge pump circuit 20 is further coupled (e.g., connected) to the source terminal of the transistor device 10, and also to ground. The charge pump circuit 20 comprises a capacitive device (e.g., capacitor) 25 as well as a first switch 21, a second switch 22, a third switch 23, and a fourth switch 24. The first to fourth switches 21-24 may be transistor switches, for example. The first to fourth switches 21-24 are arranged to alternatively couple (e.g., connected) the capacitive device 25 between the input node of the charge pump circuit 20 and ground, or between the source terminal of the transistor device 10 and the output node of the charge pump circuit 20. To this end, the first switch 21 may be coupled (e.g., connected) between the input node of the charge pump circuit 20 and a first terminal of the capacitive device 25. The second switch 22 may be coupled (e.g., connected) between a second terminal of the capacitive device 25 and ground. The third switch 23 may be coupled (e.g., connected) between the first terminal of the capacitive device 25 and the output node of the charge pump circuit 20, and the fourth switch may be coupled (e.g., connected) between the second terminal of the capacitive device and the source terminal of the transistor device 10.

Thus, the charge pump circuit 20 uses four (preferably small) switches and a capacitive element (e.g., a capacitor) as the power saving element to transfer the energy to the gate terminal of the transistor device 10. With this concept, if the source voltage Vs at the transistor device is, for example, 2V and the predetermined voltage is 5V, the gate voltage Vg can become up to 7V (2V+5V), so that the gate-source voltage Vgs becomes up to 5V, i.e., the maximum safe voltage in the present example.

The circuit 200A may further comprise a control circuit for controlling the charge pump circuit 20 (not shown in the figure). The control circuit may be adapted to control the first to fourth switches 21-24 to alternatively couple the capacitive device 25 between the input node of the charge pump circuit 20 and ground, or to couple the capacitive element 25 between the source terminal of the transistor device 10 and the output node of the charge pump circuit 20. To this end, the first and second switches 21, 22 may be switched under control of a first control signal $\phi_1$ and the third and fourth switches 23, 24 may be switched under control of a second control signal $\phi_2$. The first and second control signals may be non-overlapping (e.g., may be in antiphase to each other), such that the third and fourth switches 23, 24 are open (i.e., in the non-conducting state) while the first and second switches are closed (i.e., in the fully conducting state), and vice versa.

The charge pump circuit 20 in the circuit 200A may be referred to as Bootstrapped Load Switch (BLS).

Charge pump operation by the charge pump circuit 20 may proceed as follows. While the transistor device 10 is in the off-state, the capacitive element 25 may be coupled between the input node of the charge pump circuit 20 and ground, to charge the capacitive device 25 to a voltage that is equal to the voltage at the input node of the charge pump circuit 20, e.g., the predetermined voltage on the circuit 200A. When the transistor device 10 should be switched on, the capacitive element 25 is alternatingly coupled between the source terminal of the transistor device 10 and the output node of the charge pump circuit 20 (i.e., to the gate terminal of the transistor device 10), and between the input node of the charge pump circuit 20 and ground, to thereby provide a voltage to the gate terminal that exceeds the source voltage Vs by up to the predetermined voltage. In this state, the switches of the charge pump circuit 20 may switch with a predetermined switch rate (switch frequency), such as 32 kHz, for example.

In other words, using the charge pump circuit 20 as a local charge pump for the transistor device 10, the gate terminal of the transistor device 10 can receive always a voltage that lies above the output voltage Vout (i.e., the voltage at the source terminal of the transistor device 10) by the predetermined voltage.

The circuit 200A may further comprise a second charge pump circuit 80 (a global charge pump) that generates or outputs the predetermined voltage for the entire circuit (e.g., for the entire chip). As noted above, the predetermined voltage may be the voltage Vgsmax. The second charge pump circuit 80 may comprise two transistors 82, 84 (e.g., PMOS transistors in the example of FIG. 4) that form a current mirror. The second charge pump circuit 80 may further comprise a current generator (e.g., current sink) for sinking a bias current through the transistor 82. Notably, this implementation of the second charge pump circuit 80 is a non-limiting example, and alternative implementations of the second charge pump circuit 80 as well as alternative means for generating the predetermined voltage are feasible in the context of the present disclosure.

In the example of FIG. 4, the drive circuit (pre-driver) 30 is coupled (e.g., connected) to the input node of the charge pump circuit 20. The drive circuit 30 is adapted to control the (magnitude of the) voltage at the input node of the charge pump circuit 20 in accordance with the feedback control. This can be done by sinking a current from the input node of the charge pump circuit 20 or by sourcing a current to the input node of the charge pump circuit 20.

As indicated above, the feedback control is based on a quantity indicative of the current flowing through the transistor device or the voltage drop across the transistor device. The drive circuit 30 can be adapted to compare the quantity indicative of the current flowing through the transistor device or the voltage drop across the transistor device to a reference value for said quantity. Further, the drive circuit 30 can be adapted to sink the current from the input node of the charge pump circuit 20 based on a result of the comparison, or to source the current to the input node of the charge pump circuit 20 based on the result of the comparison.

To implement this scheme, the circuit 200A comprises a replica device 90 of the transistor device 10 that is coupled (e.g., connected) in parallel to the transistor device 10. Control terminals (e.g., gate terminals) of the replica device 90 and the transistor device 10 are coupled (e.g., connected) to each other. Further, source terminals of the replica device 90 and the transistor device 10 are coupled (e.g., connected) to each other. The on-state resistances of the replica device 90 and the transistor device 10 may be in a predetermined ratio to each other. This ratio may be referred to as the sense ratio. Then, the current flowing through the replica device (sense current) is given by the current flowing through the transistor device 10, divided by the sense ratio. The sense current is an example of the quantity indicative of the current flowing through the transistor device 10 or the voltage drop across the transistor device 10.

To achieve a larger sense ratio, the replica device 90 may be formed by a series connection of a plurality of devices, e.g., transistors 92 and 94 in FIG. 4, in order to increase the on-state resistance of the replica device 90. Notably, the replica device 90 shall not be limited to having twice the on-state resistance of the transistor device 10, and typically much larger sense ratios are chosen in order to limit power consumption by the quiescent current.

The replica device 90 may be said to perform the function of the feedback control block 50 in FIG. 2.

Further, the drive circuit 30 comprises a differential amplifier 32, a current generator (e.g., current sink) 34, a first drive circuit transistor 36, and a second drive circuit transistor 38. The current generator 34 is coupled (e.g., connected) between the replica device 90 and ground and generates (e.g., sinks) a current that serves as a reference value for the aforementioned quantity (e.g., that serves as a reference current for the sense current). This reference current can be used to select different current limit levels. The differential amplifier 32 receives, at its input terminals respectively the voltage at the source terminal of the transistor device 10 (e.g., the output voltage Vout) and the voltage at an intermediate node between the replica device 90 and the current generator 34. For example, the positive (non-inverting) input terminal may receive the voltage at the source terminal of the transistor device 10, and the negative (inverting) input terminal may receive the voltage at the intermediate node. The first drive circuit transistor 36 is coupled (e.g., connected) between the intermediate node and ground and operates under control of the differential amplifier 32, e.g., is driven by the differential amplifier 32. To this end, the output of the differential amplifier 32 may be coupled (e.g., connected) to the control terminal (e.g., gate terminal) of the first drive circuit transistor 36. In this configuration, if for example the sense current exceeds the current generated by the current generator 34, the differential amplifier 32 will sense this and will generate a more positive output. This in turn will more strongly bias the control terminal (e.g., gate terminal) of the first drive circuit transistor 36, thereby increasing the current that flows through the first drive circuit transistor 36 to ground.

The second drive circuit transistor 38 is coupled (e.g., connected) between the input node of the charge pump circuit 20 and ground. The current flowing through the first drive circuit transistor 36 will be replicated and increased by a given scale factor in the second drive circuit transistor 38 (that is, the current flowing through the second drive circuit transistor 38 will be given by the current flowing through the first drive circuit transistor 36 multiplied by the scale factor, i.e., the currents are proportional to each other). Control terminals (e.g., gate terminals) of the first and second drive circuit transistors are coupled (e.g., connected) to each other. In this configuration, the current flowing through the second drive circuit transistor 38 is in a predetermined ratio (mirror ratio) to the current flowing through the first drive circuit transistor 36. Thereby, the current Ictrl that is sunk from the input node VCTRL of the charge pump circuit 20 is controlled by the differential amplifier 32, in dependence on the sense current Isense. For example, if the current flowing through the first drive circuit transistor 36 increases under control of the differential amplifier 32, also the current that flows to ground from the input node VCTRL of the charge pump circuit 20 through the second drive circuit transistor 38 increases. In consequence, the voltage at the input node VCTRL of the charge pump circuit 20 is controlled in dependence on the sense current Isense, or more specifically, in dependence on a result of the comparison of the sense current Isense to the current generated by the current generator 34. In this example, if the sense current Isense becomes too large (e.g., if the current flowing through the transistor device 10 becomes too large), the voltage at the input node VCTRL of the charge pump circuit 20 is lowered by the current Ictrl flowing through the second drive circuit transistor 38 to ground. Thereby, also the voltage (boost voltage) at the output node of the charge pump circuit 20 is lowered, and the gate-source voltage Vgs of the transistor device 10 is lowered.

In consequence, the circuit 200A ensures that that the gate-source voltage of the transistor device 10 is given by Vgs=VOUT+VCTRL, where VOUT is the output voltage (i.e., voltage at the source terminal of the transistor device 10) and VCTRL is the voltage at the input node of the charge pump circuit 20, which is modified by the feedback control described above.

Typically, the voltage at the input node VCTRL of the charge pump circuit 20 only requires control during start-up, e.g., after the transistor device 10 has been switched to the on-state, or if an external load current changes. Under stable conditions, the voltage at the input node of the charge pump circuit 20 is equal to the predetermined voltage on the circuit, and the gate-source voltage Vgs of the transistor device 10 (which is equal to the boost voltage in this example) becomes the maximum safe voltage. That is, under stable operating conditions, the current Ictrl may be zero.

In general, the circuit 200A may be said to regulate the output current (i.e., the current flowing through the transistor device 10) by controlling the voltage at the input node of the charge pump circuit 20. This is done by controlling the current Ictrl that is sunk from the input node VCTRL of the charge pump circuit 20. Notably, in alternative implementations, a control current may be sourced to the input node of the charge pump circuit 20 in order to control the voltage at the input node of the charge pump circuit 20.

Notably, while the feedback control in the circuit 200A is based on the sense current, in alternative implementations it may be based on a feedback signal indicative of a change rate (e.g., slew rate) of the voltage Vs at the source terminal of the transistor device 10, with evident adaptations. Means for deriving such a feedback signal will be described below with reference to FIG. 6.

Important aspects of the aforementioned implementation are to first take care that no safe operating area (SOA) violation occurs for the used devices (e.g., 5V devices, in which case the predetermined voltage, or maximum safe voltage Vgsmax, would be 5V), and second to appropriately control the switches 21-24 of the charge pump circuit 20 that charge and discharge the local capacitor (capacitive device) 25.

The benefits of the proposed circuit are a significant reduction of on-state resistance of the transistor device by increasing the gate source voltage Vgs, independence of the output resistance of the input and output voltages, and support of output current limitation, by controlling the amount of energy that is transferred to the control terminal (e.g., gate terminal) of the transistor device.

Broadly speaking, this is achieved by combining a constant controlled voltage (predetermined voltage; e.g., 5V from a global charge pump) with a storage element (local capacitor). The controlling switches of the charge pump circuit enable the transfer of this constant voltage to the gate-source voltage Vgs (e.g., such that Vg=Vs+5V).

As simulations of the reduction of the on-state resistance of the transistor device 10 in the circuit 200A have shown, the size of the transistor device 10 (e.g., NMOS transistor) can be reduced by up to 25% at constant on-state resistance if the gate-source voltage Vgs is raised from 3V (the maximum attainable voltage assuming that the supply voltage on the circuit is 5V and the source voltage Vs of the transistor device is 2V) up to 5V.

Figure 8:
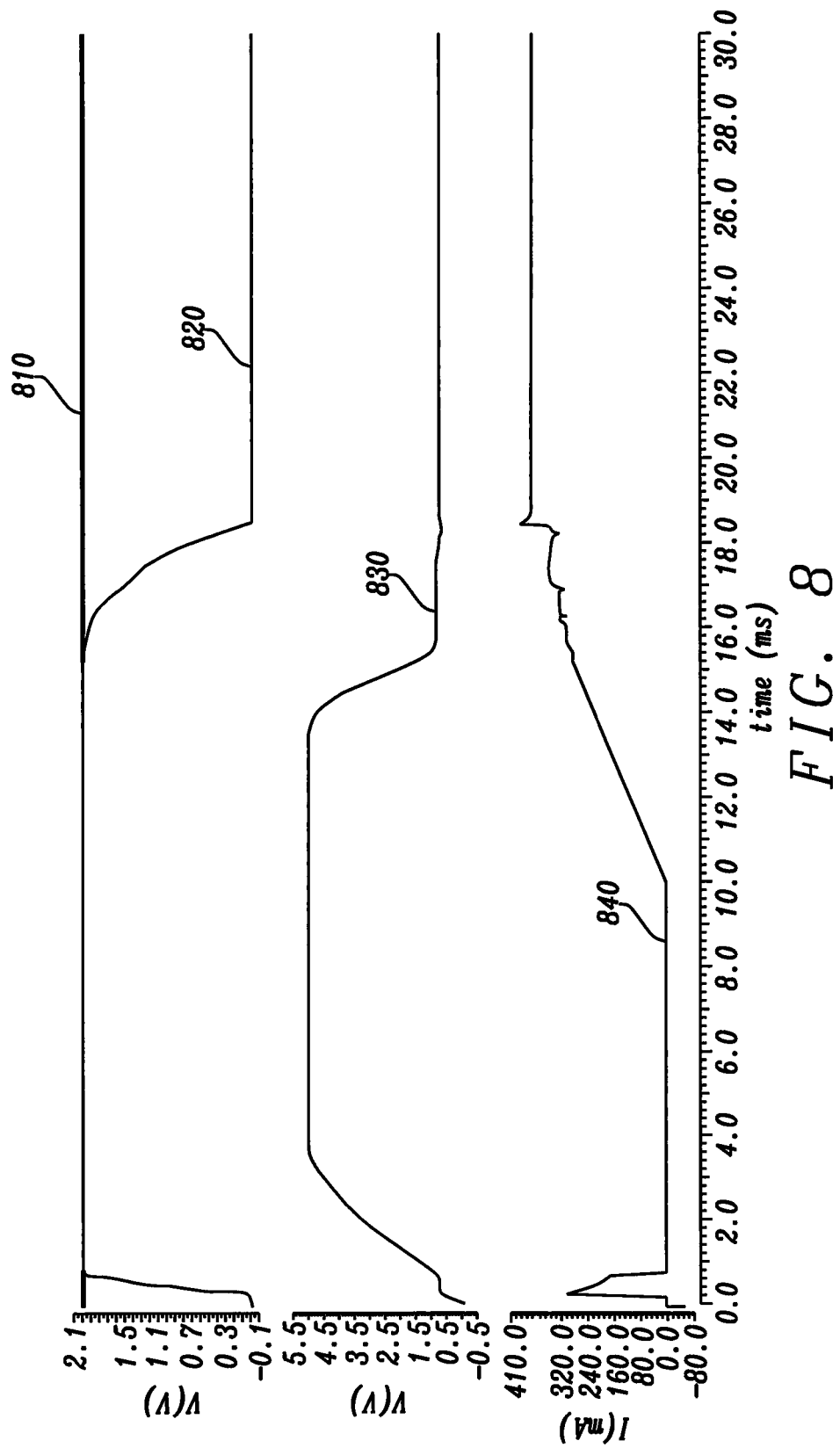

FIG. 8 schematically illustrates examples of simulated currents and voltages as functions of time in the circuit 200A of FIG. 4. It shows the turn-on process of the switch device and the set-in of the current limit regime when the output current load increases above a programmable threshold (e.g., 390 mA in FIG. 8). Line 810 indicates the input voltage Vin (drain voltage Vd of the transistor device 10), line 820 indicates the output voltage Vout (source voltage Vs of the transistor device 10), line 830 indicates the gate-source voltage Vgs of the transistor device 10, and line 840 indicates the output current Iout (the current flowing through the transistor device 10). The input voltage Vin remains constant during the simulated process. The transistor device 10 is activated by increasing the gate-source voltage Vgs. At the same time, the output voltage Vout increases. The output current Iout spikes and then returns to a stable value. At around 10 ms, the external load is simulated to draw a larger load current, and the output voltage Iout drops accordingly. As soon as the programmable threshold is reached, the drive circuit performs its feedback control which reduces the gate-source voltage Vgs. As a consequence of the feedback control, the output current Iout takes a value that is equal to the programmable threshold.

Figure 5:
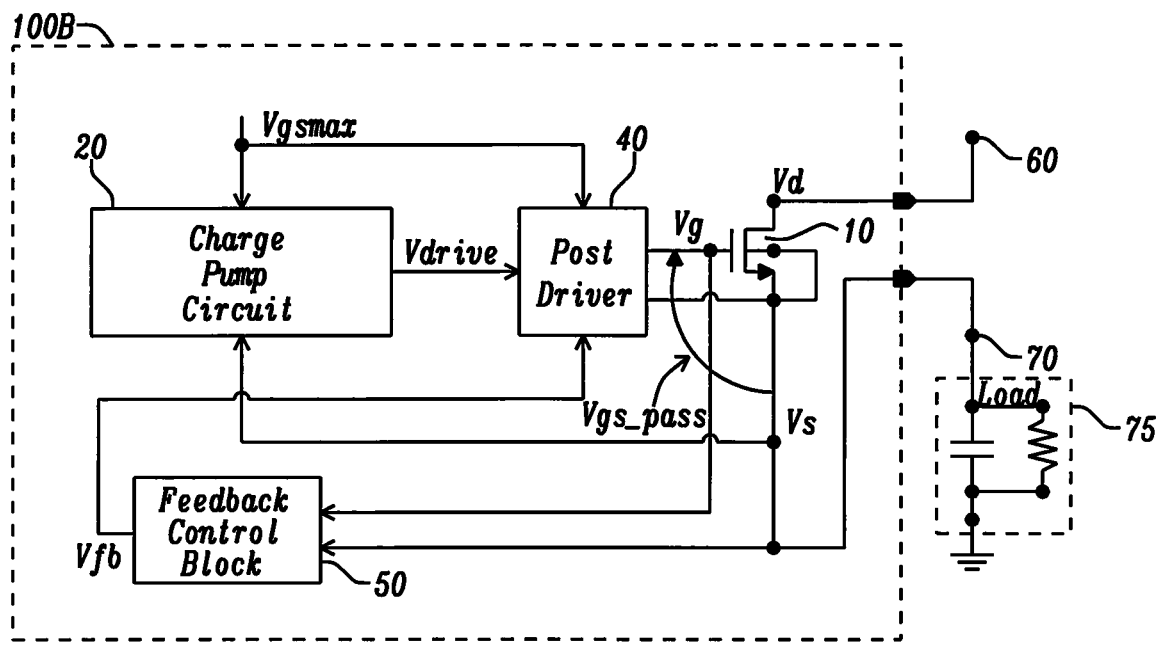

FIG. 5 schematically illustrates an example of another high-level diagram of a circuit 100A according to embodiments of the disclosure. The circuit 100B may be said to be a circuit for providing a switchable current linkage (e.g., switching capability) between a first terminal 60 and a second terminal 70. The circuit 100B differs from circuit 100 in FIG. 2 in that it only includes the post-driver 40. The post-driver 40 (as an example of a drive circuit) is coupled (e.g., connected) to the output node of the charge pump circuit 20. In particular, the post-driver 40 is coupled (e.g., connected) to the control terminal (e.g., gate terminal) of the transistor device 10 and is supplied by an output of the charge pump circuit 20.

Figure 6:
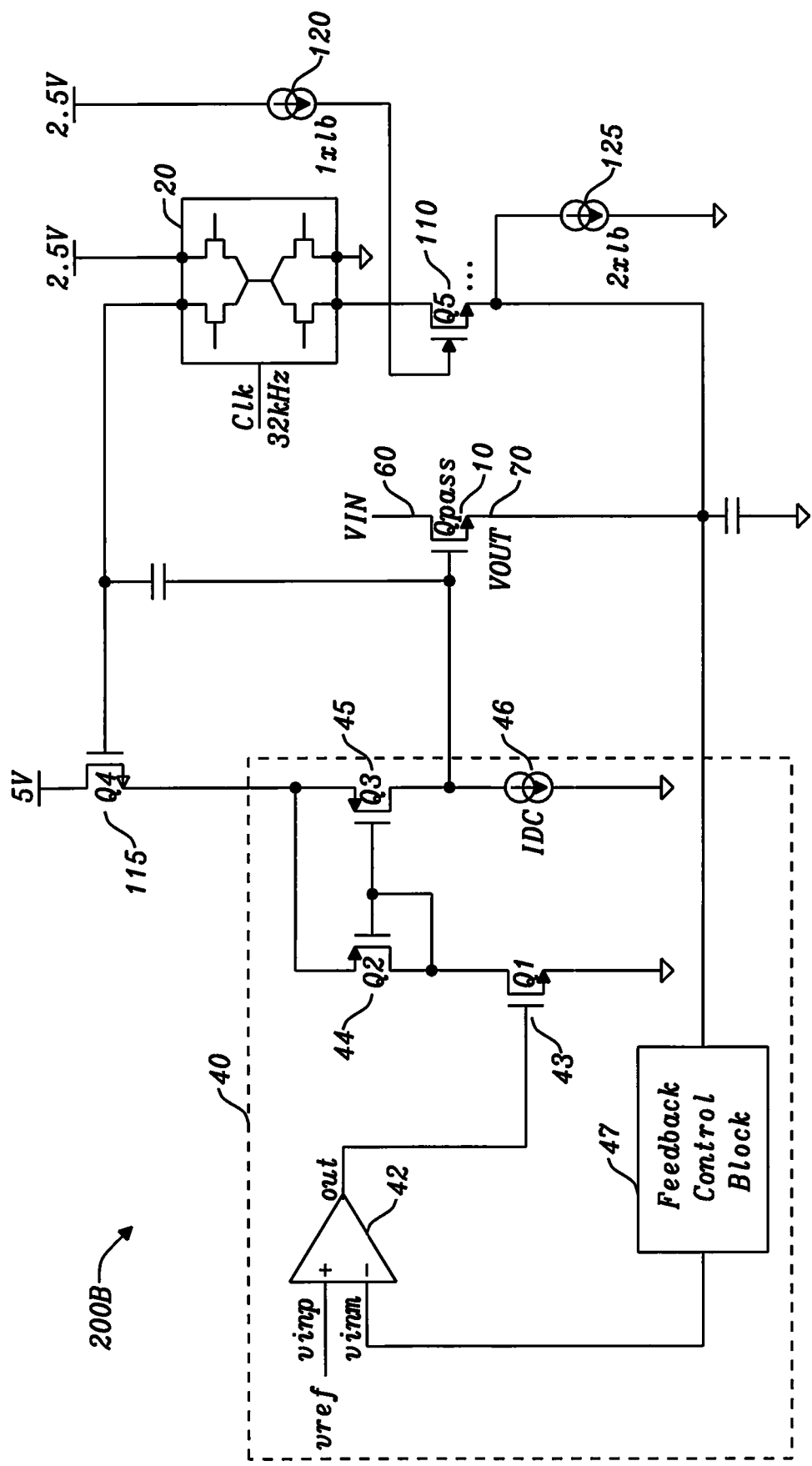

FIG. 6 schematically illustrates an example of a circuit 200B implementing the high-level circuit 100A of FIG. 5. The circuit 200B may be said to be a circuit for providing a switchable current linkage (e.g., switching capability) between a first terminal 60 and a second terminal 70. The circuit 200B is an implementation using a post-driver 40 with slew rate control (e.g., slew rate limit). As was the case for the above circuits, circuit 200B comprises a transistor device 10 (e.g., pass device) coupled (e.g., connected) between the first terminal 60 and the second terminal 70. The transistor device 10 may act as a switch device (or simply, switch).

The circuit 200B further comprises a charge pump circuit 20. External couplings of the charge pump circuit 20 may be those described above with reference to FIG. 2, FIG. 3, and FIG. 4. For instance, the input node of the charge pump circuit 20 is coupled (e.g., connected) to the predetermined voltage on the circuit 200B (e.g., 2.5V in FIG. 6), and the output node of the charge pump circuit is coupled (e.g., connected) to the control terminal (e.g., gate terminal) of the transistor device 10. In the present example, the output node of the charge pump circuit 20 is coupled to the control terminal of the transistor device 10 via the drive circuit 40. The predetermined voltage may be the voltage Vgsmax (e.g., 2.5V in the present example). The charge pump circuit 20 is further coupled (e.g., connected) to the source terminal of the transistor device 10, and also to ground. In particular, the charge pump circuit 20 may be coupled to the source terminal of the transistor device 10 via a supply-side transistor 110. A source terminal of the supply-side transistor 110 is coupled (e.g., connected) to the source terminal of the transistor device 10 and is coupled to ground via a first supply-side current generator (e.g., current sink). A control terminal (e.g., gate terminal) of the supply-side transistor 110 is coupled (e.g., connected) to a drain terminal of the transistor 110. The drain terminal of the supply-side transistor 110 is further coupled to the predetermined voltage, via a second supply-side current generator (e.g., current source) 120. The magnitude of the current generated (e.g., sunk) by the first supply-side current generator 125 may be twice the magnitude of the current generated (e.g., sourced) by the second supply-side current generator 120.

Figure 7:
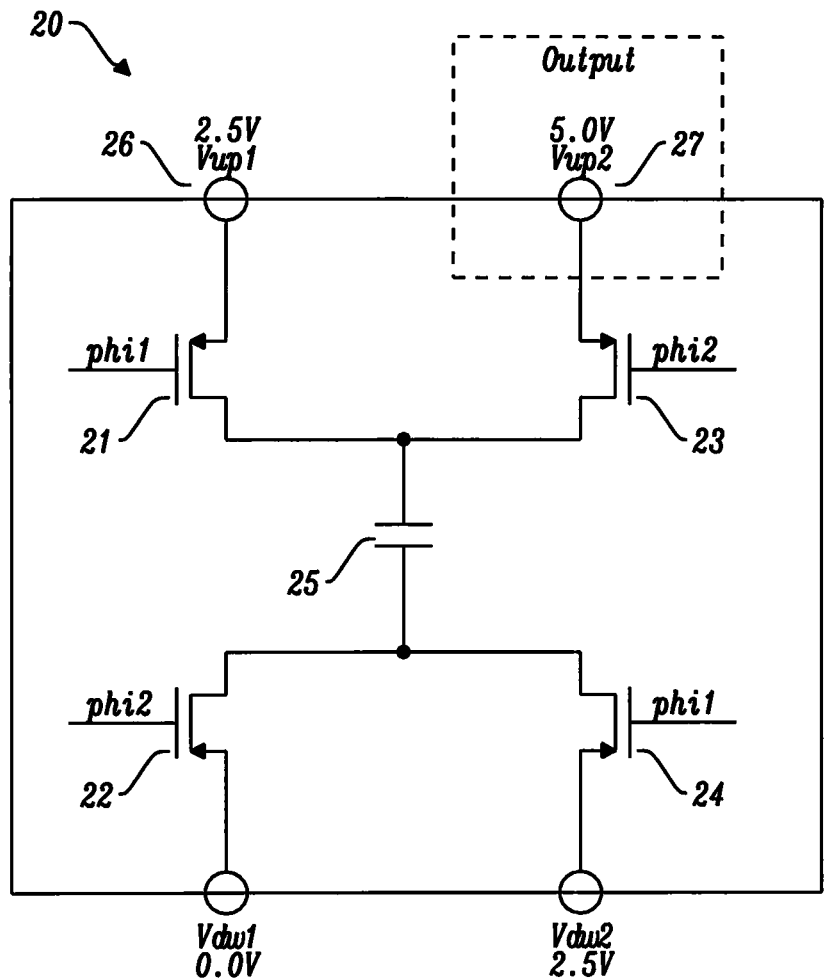

The internal configuration of the charge pump circuit 20 in this example may be the same as illustrated in and described with reference to FIG. 4. FIG. 7 shows a possible implementation of the charge pump circuit 20. Also here, the charge pump circuit 20 comprises a capacitive device (e.g., capacitor) 25 as well as a first switch 21, a second switch 22, a third switch 23, and a fourth switch 24. The first to fourth switches 21-24 are implemented by transistors (e.g., NMOS transistors). The first to fourth switches 21-24 are arranged to alternatively couple (e.g., connect) the capacitive device 25 between the input node of the charge pump circuit 20 and ground, or between the source terminal of the transistor device 10 and the output node of the charge pump circuit 20.

In FIG. 7, assuming Vup2 denotes the high impedance net (capacitive), the series resistance of the Vup2 pin is given by R=1/fC (with f being the switch frequency and C being the capacitance of the capacitive element 25) and the output voltage is given by Vup2 (Vup1−Vdw1)+Vdw2.

In the example of FIG. 6, the charge pump circuit 20 may be part of a charge-pump based regulator, since the example assumes access to the high voltage domain (reference voltage level, e.g., 5V) and there is no need for pumping directly to the gate of the switch. Instead, the charge pump based regulator provides the drive circuit with a stable supply (e.g., Vgsmax+Vs, or Vgsmax+Vs+Vthr, Vthr denoting a threshold voltage of a transistor). The accuracy of presented regulator depends strongly on matching between the regulating transistor 115 and the supply-side transistor 125 (both described below). For example, the gate-source voltages of these transistors should be equal to each other.

For further details concerning the charge pump circuit 20, reference is made to the above description of the charge pump circuit 20 of the circuit 200A in FIG. 4.

The circuit 200B may further comprise a control circuit for controlling the charge pump circuit 20 (not shown in the figure). Operation of the control circuit may be the same as that of the control circuit in circuit 200A described above with reference to FIG. 4. Further, charge pump operation by the charge pump circuit 20 may proceed in the same manner as described above with reference to FIG. 4.

The circuit 200B may further comprise a second charge pump circuit (a global charge pump; not shown in the figure) that outputs the predetermined voltage for the entire circuit (e.g., for the entire chip). As noted above, the predetermined voltage may be the voltage Vgsmax. Alternative means for generating the predetermined voltage are feasible in the context of the present disclosure.

The charge pump circuit 20 generates a boost voltage at a voltage level Vdrive that is equal to the voltage Vs on the source of the transistor device 10 plus at least the predetermined voltage (e.g., maximum safe voltage Vgsmax, so that Vdrive=Vs+Vgsmax). In certain implementations, Vdrive may lie above the voltage Vs by the predetermined voltage plus a threshold voltage of a transistor (e.g., the supply-side transistor 125). The voltage level Vdrive can be generated using charge pumping methods, for example, as explained in the present disclosure. Using the charge pump, the voltage level Vdrive can exceed the maximum available voltage level in the design for, e.g., a NMOS switch, or in case of a PMOS switch Vdrive can become the lowest voltage level in the design. The voltage level Vdrive is then provided to the gate of the switch through the drive circuit 40. The driving circuit 40 should be used for providing feedback control of the turn on speed and/or current of the switch.

In the example of FIG. 6, the drive circuit (post-driver) 40 is coupled (e.g., connected) to the output node of the charge pump circuit 20. The drive circuit 40 is supplied by the output of the charge pump circuit 20 and is adapted to control the (magnitude of the) voltage at the control terminal (e.g., gate terminal) of the transistor device 10 in accordance with the feedback control. This can be done by sinking a current from the control terminal (e.g., gate terminal) of the transistor device 10 or by sourcing a current to the control terminal (e.g., gate terminal) of the transistor device 10.

As indicated above, the feedback control is based on a quantity indicative of the current flowing through the transistor device or the voltage drop across the transistor device. The drive circuit 40 can be adapted to compare the quantity indicative of the current flowing through the transistor device or the voltage drop across the transistor device to a reference value for said quantity. Further, the drive circuit 40 can be adapted to sink the current from the control terminal of the transistor device 10 based on a result of the comparison, or to source the current to the control terminal of the transistor device 10 based on the result of the comparison.

To implement this scheme, the drive circuit 40 in the circuit 200B comprises a feedback control block 47 that is coupled (e.g., connected) to the source terminal of the transistor device 10 and outputs a signal (feedback signal; e.g., voltage or current) that is indicative of a change rate (e.g., slew rate) of the voltage at the source terminal of the transistor device 10 (e.g., a change rate or slew rate of the output voltage Vout). The signal output by the feedback control block 47 is an example of the quantity indicative of the current flowing through the transistor device 10 or the voltage drop across the transistor device 10. As noted above, the circuit 200B implements a post-driver 40 (as an example of a drive circuit) with slew rate control of the output voltage Vout.

The circuit 200B further comprises a differential amplifier 42, a first drive circuit transistor 43, a second drive circuit transistor 44, a third drive circuit transistor 45, and a current generator (e.g., current sink) 46. The output of the feedback control block 47 is provided to one input terminal (e.g., the negative, or inverting input terminal) of the differential amplifier 42, and a reference signal (e.g., reference voltage or reference current) for the feedback signal is provided to the other input terminal (e.g., the positive or non-inverting input terminal) of the differential amplifier 42. The first drive circuit transistor 43 and the second drive circuit transistor 44 are coupled (e.g., connected) in series between the output node of the charge pump circuit 20 and ground. Further, the third drive circuit transistor 45 and the current generator 46 are coupled (e.g., connected) in series between the output node of the charge pump circuit 20 and ground, in parallel to the first and second drive circuit transistors 43, 44. The second drive circuit transistor 44 and the third drive circuit transistor 45 form a current mirror. An intermediate node between the third drive circuit transistor 45 and the current generator 46 is coupled (e.g., connected) to the control terminal (e.g., gate terminal) of the transistor device 10.

The first drive circuit transistor 43 operates under control of the differential amplifier 42, e.g., is driven by the differential amplifier 42. To this end, the output of the differential amplifier 42 may be coupled (e.g., connected) to the control terminal (e.g., gate terminal) of the first drive circuit transistor 43. In this configuration, if for example the signal output by the feedback control block 47 is larger than the reference signal, the differential amplifier 42 will sense this and will generate a more negative output. This in turn will less strongly bias the control terminal (e.g., gate terminal) of the first drive circuit transistor 43, thereby increasing the resistance of the first drive circuit transistor 43 and decreasing the current that flows through the first drive circuit transistor 36 and the second drive circuit transistor 44 to ground.

Since the third drive circuit transistor 45 forms a current mirror with the second drive circuit transistor 44, the current flowing through the third drive circuit transistor 45 is in a predetermined ratio (mirror ratio) to the current flowing through the first and second drive circuit transistors 43, 44. Thereby, the current that flows through the third drive circuit transistor 45, and thereby the voltage at the intermediate node between the third drive circuit transistor 45 and the current generator 46 is controlled by the differential amplifier 42, based on the signal output by the feedback control block 47. In particular, if the signal output by the feedback control block 47 exceeds the reference signal, the voltage at the control terminal of the transistor device 10 is reduced.

In certain implementations, the circuit 200B may further comprise a regulating circuit coupled (e.g., connected) between the output node of the charge pump circuit 20 and the drive circuit 40. In particular, the regulation circuit may be arranged between the output node of the charge pump circuit 20 and the series connection of the first and second drive circuit transistors 43, 44. That is, the first and second drive circuit transistors 43, 44 may be coupled to the output node of the charge pump circuit 20 via the regulating circuit. The regulating circuit may be adapted to apply a DC shift to the output of the charge pump circuit 20 and/or to reduce an output impedance of the charge pump circuit 20. In one implementation, the regulating circuit comprises or consists of a transistor (e.g., regulating transistor) 115. A source terminal of the regulating transistor 115 is coupled (e.g., connected) to the series connection of the first and second drive circuit transistors, for example to the source terminal of the second drive circuit transistor 44 (which is a PMOS transistor in the example of FIG. 6). A control terminal (e.g., gate terminal) of the regulating transistor 115 is coupled (e.g., connected) to the output node of the charge pump circuit 20. A drain terminal of the regulating transistor is coupled to a reference voltage level (e.g., 5V in the example of FIG. 6). It is important to note that the voltage at the gate of the regulating transistor 115 may exceed the reference voltage level. One effect of providing the regulating transistor 115 is that it subtracts a threshold voltage from the boost voltage. Thereby, an increase of the boost voltage by the threshold voltage of the supply-side transistor 110 can be compensated for (provided that the supply-side transistor 110 and the regulating transistor 115 are identical, or at least sufficiently similar with regard to their threshold voltages).

Notably, while the feedback control in the circuit 200B is based on the feedback signal that is indicative of a slew rate of the source voltage of the transistor device 10, in alternative implementations it may be based on a sense current of the current flowing through the transistor device 10, with evident adaptations. Means for deriving such a sense current have been described above with reference to FIG. 4.

In summary, the present disclosure proposes a technique (method and apparatus) to reduce the on-state resistance of a transistor device that acts as a switch device, which is not possible with conventional techniques. Several implementations have been described as non-limiting examples of the disclosure.

It is understood that all transistors and transistor devices mentioned throughout the disclosure may be FETs, such as MOSFETs (e.g., PMOS transistors or NMOS transistors).

It is further understood that while the drawings and example embodiments of the present disclosure relate to a NMOS transistor device (pass device) acting as a switch device, the present disclosure is also applicable to circuits with a PMOS transistor device (pass device) acting as a switch device, with evident adaptations.

Unless indicated otherwise, elements of a series connection of two or more elements may be coupled (e.g., connected) to each other in any order, not just the order explicitly stated.

It should be noted that the apparatus features described above correspond to respective method features that may however not be explicitly described, for reasons of conciseness. The disclosure of the present document is considered to extend also to such method features. In particular, the present disclosure is understood to relate to methods of operating the circuits described above, and/or to providing or arranging respective elements of theses circuits.

It should further be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A circuit for providing a switchable current linkage between a first terminal and a second terminal, the circuit comprising:
   a transistor device that acts as a switch device;
   a charge pump circuit, wherein an output node of the charge pump circuit is coupled to a control terminal of the transistor device and an input node of the charge pump circuit is coupled to a predetermined voltage on the circuit, and wherein the charge pump circuit is adapted to generate a boosted voltage that has the same sign as a voltage at the input node of the charge pump circuit but a greater magnitude than the voltage at the input node of the charge pump circuit; and
   a drive circuit coupled to the charge pump circuit,
   wherein the drive circuit is adapted to provide feedback control for controlling a current flowing through the transistor device based on a quantity indicative of the current flowing through the transistor device or a voltage drop across the transistor device; and
   the drive circuit is further adapted to:
   control a magnitude of the voltage at the input node of the charge pump circuit in accordance with the feedback control, or control a magnitude of a voltage at the control terminal of the transistor device in accordance with the feedback control when being coupled to the output node of the charge pump circuit and being supplied by an output of the charge pump circuit,
   wherein the drive circuit is coupled to the input node of the charge pump circuit, and wherein the drive circuit is adapted to control the magnitude of the voltage at the input node of the charge pump circuit in accordance with the feedback control, by sinking a current from the input node of the charge pump circuit or by sourcing a current to the input node of the charge pump circuit.

2. The circuit according to claim 1, wherein the charge pump circuit is also coupled to a source terminal of the transistor device and is adapted to output, as the boosted voltage, a voltage the magnitude of which exceeds the magnitude of the voltage at the input node of the charge pump circuit by at least the magnitude of a voltage at the source terminal of the transistor device.

3. The circuit according to claim 1, wherein the charge pump circuit comprises:
   a capacitive device; and
   first to fourth switches arranged to alternatingly couple the capacitive device between the input node of the charge pump circuit and ground, and between the source terminal of the transistor device and the output node of the charge pump circuit.

4. The circuit according to claim 3, wherein the first switch is coupled between the input node of the charge pump circuit and a first terminal of the capacitive device, the second switch is coupled between a second terminal of the capacitive device and ground, the third switch is coupled between the first terminal of the capacitive device and the output node of the charge pump circuit, and the fourth switch is coupled between the second terminal of the capacitive device and the source terminal of the transistor device.

5. The circuit according to claim 3, further comprising a control circuit for controlling the charge pump circuit,
wherein the control circuit is adapted to control the first to fourth switches to alternatingly couple the capacitive device between the input node of the charge pump circuit and ground, and between the source terminal of the transistor device and the output node of the charge pump circuit.

6. The circuit according to claim 1, wherein the drive circuit is adapted to compare the quantity indicative of the current flowing through the transistor device or the voltage drop across the transistor device to a reference value for said quantity, and to sink the current from the input node of the charge pump circuit based on a result of the comparison or to source the current to the input node of the charge pump circuit based on the result of the comparison.

7. The circuit according to claim 1, further comprising a replica device of the transistor device, wherein the replica device is connected in parallel to the transistor device and a control terminal of the replica device is coupled to the control terminal of the transistor device,
wherein the drive circuit comprises:
a current generator coupled between the replica device and ground;
a differential amplifier, one input terminal of which is coupled to an intermediate node between the current generator and the replica device, and the other input terminal of which is coupled to the source terminal of the transistor device;
a first drive circuit transistor that operates under control of the differential amplifier and is coupled between the intermediate node and ground; and
a second drive circuit transistor that forms a current mirror with the first drive circuit transistor and is coupled between the input node of the charge pump circuit and ground.

8. The circuit according to claim 1, further comprising a second charge pump circuit for generating the predetermined voltage.

9. A method of controlling a circuit for providing a switchable current linkage between a first terminal and a second terminal, wherein the circuit comprises a transistor device that acts as a switch device, the method comprising the steps of:
generating, by means of a charge pump circuit, a boosted voltage that has the same sign as a voltage at an input node of the charge pump circuit but a greater magnitude than the voltage at the input node of the charge pump circuit, wherein an output node of the charge pump circuit is coupled to a control terminal of the transistor device and the input node of the charge pump circuit is coupled to a predetermined voltage on the circuit;
providing feedback control for controlling a current flowing through the transistor device based on a quantity indicative of the current flowing through the transistor device or a voltage drop across the transistor device; and
controlling a magnitude of the voltage at the input node of the charge pump circuit in accordance with the feedback control or controlling a magnitude of a voltage at the control terminal of the transistor device in accordance with the feedback control,
wherein the method further comprises the step of:
controlling the magnitude of the voltage at the input node of the charge pump circuit in accordance with the feedback control, by sinking a current from the input node of the charge pump circuit or by sourcing a current to the input node of the charge pump circuit.

10. The method according to claim 9, wherein the charge pump circuit is also coupled to a source terminal of the transistor device, and the method comprises the step of:
generating, as the boosted voltage, a voltage the magnitude of which exceeds the magnitude of the voltage at the input node of the charge pump circuit by at least the magnitude of a voltage at the source terminal of the transistor device.

11. The method according to claim 9, wherein the charge pump circuit comprises:
a capacitive device; and
first to fourth switches arranged to alternatingly couple the capacitive device between the input node of the charge pump circuit and ground, and between the source terminal of the transistor device and the output node of the charge pump circuit.

12. The method according to claim 11, wherein the first switch is coupled between the input node of the charge pump circuit and a first terminal of the capacitive device, the second switch is coupled between a second terminal of the capacitive device and ground, the third switch is coupled between the first terminal of the capacitive device and the output node of the charge pump circuit, and the fourth switch is coupled between the second terminal of the capacitive device and the source terminal of the transistor device.

13. The method according to claim 11, further comprising the step of:
controlling the first to fourth switches to alternatingly couple the capacitive device between the input node of the charge pump circuit and ground, and between the source terminal of the transistor device and the output node of the charge pump circuit.

14. The method according to claim 9, further comprising the step of:
comparing the quantity indicative of the current flowing through the transistor device or the voltage drop across the transistor device to a reference value for said quantity; and sinking the current from the input node of the charge pump circuit based on a result of the comparison or sourcing the current to the input node of the charge pump circuit based on the result of the comparison.

15. The method according to claim 9, further comprising the steps of:
sensing a current that flows through a replica device of the transistor device, wherein the replica device is connected in parallel to the transistor device and a control terminal of the replica device is coupled to the control terminal of the transistor device;
sinking a predetermined current from the replica device to ground by means of a current generator;
comparing a voltage at an intermediate node between the current generator and the replica device and the voltage at the source terminal of the transistor device by means of a differential amplifier; and controlling a first drive circuit transistor in dependence on an output of the differential amplifier, wherein the first drive circuit transistor is coupled between the intermediate node and ground and forms a current mirror with a second drive circuit transistor that is coupled between the input node of the charge pump circuit and ground.

16. The method according to claim 9, further comprising the step of:

generating the predetermined voltage using a second charge pump circuit.

\* \* \* \* \*